United States Patent [19]

Youssef et al.

[11] Patent Number: 5,268,558
[45] Date of Patent: Dec. 7, 1993

[54] TEMPERATURE-CONTROLLED ELECTRONIC CIRCUIT

[75] Inventors: Abdul Youssef, Issy les Moulineaux; Jean-Bernard Ducrocq, Castanet Tolosan; Alain Meyer, Issy Les Moulineaux, all of France

[73] Assignee: France Telecom, Paris, France

[21] Appl. No.: 788,167

[22] Filed: Nov. 5, 1991

[30] Foreign Application Priority Data

Nov. 7, 1990 [FR] France ................. 90 13803

[51] Int. Cl.⁵ .................................. H05B 3/16
[52] U.S. Cl. ........................ 219/209; 219/543
[58] Field of Search ............ 338/307, 305, 309; 219/209, 543

[56] References Cited

U.S. PATENT DOCUMENTS

| | | | |
|---|---|---|---|
| 2,641,675 | 6/1953 | Hannahs | 338/308 |
| 4,103,144 | 7/1978 | Pizzarello | 219/209 |
| 4,146,867 | 3/1979 | Blangeard | 338/308 |
| 4,374,316 | 2/1983 | Inamori | 219/209 |
| 4,481,403 | 11/1984 | Del Monte | 219/209 |
| 5,010,233 | 4/1991 | Henschen | 219/209 |

FOREIGN PATENT DOCUMENTS

| | | |
|---|---|---|
| 0301290 | 7/1988 | Fed. Rep. of Germany . |
| 2510803 | 7/1982 | France . |
| 0334824 | 2/1989 | Sweden . |
| 1498074 | 1/1978 | United Kingdom ......... 219/543 |
| 0356087 | 8/1989 | United Kingdom . |

*Primary Examiner*—Bruce A. Reynolds
*Assistant Examiner*—Michael Switzer
*Attorney, Agent, or Firm*—Sughrue, Mion, Zinn, Macpeak & Seas

[57] ABSTRACT

A temperature-controlled electronic circuit comprises a substrate, components of the circuit on its first side and a heating array on its second side. It finds a particular application in space telecommunications.

3 Claims, 4 Drawing Sheets

TEMPERATURE-CONTROLLED ELECTRONIC CIRCUIT

BACKGROUND OF THE INVENTION

1. Field of the invention

The invention concerns a temperature-controlled electronic circuit.

2. Description of the prior art

As described in the "Space Technology Course" ("The Technology of Scientific Experiments in Space"; "The Environment of Experiments on the Orbital Vehicle" by P. Mauroy; CNES, 1981), electronic equipment on satellites can operate without risk of destruction only under appropriate temperature conditions, both in operation and in storage.

These conditions are more difficult to comply with if the electronic equipment is mounted outside the satellite, for example on an arm. In the case of eclipses of long duration it is necessary to keep the temperature of the equipment above a given limit to ensure the survival of the electronic components.

The passive thermal control means usually employed, as described in the "Space Technology Course" (1981; "The Technology of Experiments in Space", CNES; "Thermal Control of Experiments in Space" by A. Rolfo), (such as coatings of various kinds, multi-layer insulative materials, etc) are sometimes inadequate in the case of high received energy variations. It is then necessary to use active thermal control means to dissipate a variable quantity of power inside the equipment concerned.

It is known to bond to the module to be controlled flexible resistive films dissipating the necessary additional power. This solution is not applicable to highly integrated hybrid circuits, however.

An object of the invention is to overcome this thermal control problem.

SUMMARY OF THE INVENTION

The present invention consists in a temperature-controlled electronic circuit comprising a support substrate, electronic circuit components on a first side of said substrate and a heating array on a second side of said substrate.

A circuit of this kind is advantageously obtained using a known and easily reproducible manufacturing technique to enable easily adjustable and ratable active thermal control to be integrated into the substrate of the hybrid component.

This technique has been studied and developed for integration into the hybrid circuit manufacturing system. This results in high thermal yield, great ease of use and a saving in terms of weight and overall dimensions.

The characteristics and advantages of the invention will emerge from the following description given by way of non-limiting example with reference to the appended drawings.

DETAILED DESCRIPTION OF THE INVENTION

Figure 1:
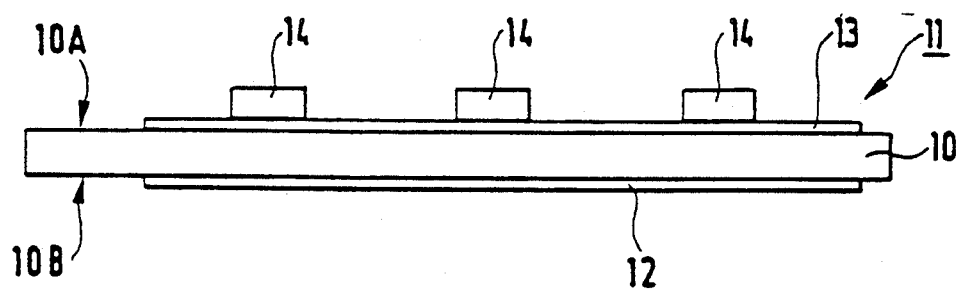
FIG. 1 is a schematic representation of a hybrid circuit in accordance with the invention.

The invention relates to the incorporation of thermal control means onto the rear surface 10B of an electronic circuit, for example a hybrid technology electronic circuit, on board a satellite.

These means consist in a compensated cellular resistive heating array 12 silkscreened onto the substrate 10 of the circuit 11, to provide the necessary additional power dissipation, the front surface 10A of the substrate being that carrying the circuit itself 13 and therefore the components 14 constituting it. The array 12 may be connected to a thermistor indicating the temperature of the circuit.

The required additional power can be obtained with great flexibility because of the series/parallel array, the facility for adjusting the ohmic resistance value by laser trimming and the facility to choose an appropriate resistive ink.

The array is silkscreened in such a way that the effects of the currents flowing within it cancel each other out to minimize electromagnetic radiation.

The invention enables:

integration of the necessary thermal control means onto the support of the electronic circuit, compensation for the electromagnetic effects produced, highly redundant operation.

In one example of implementation of a hybrid macrocomponent integrating protection against radiation and thermal control, two types of layout of the heating arrangement have been developed: a series configuration and a parallel configuration.

The basic idea is to dissipate a given energy in a resistor R supplied at a voltage U so that the nominal power dissipated is $p = U^2/R$. The resistor R is obtained by silkscreening a resistive ink onto the back of the circuit substrate.

Figure 2:
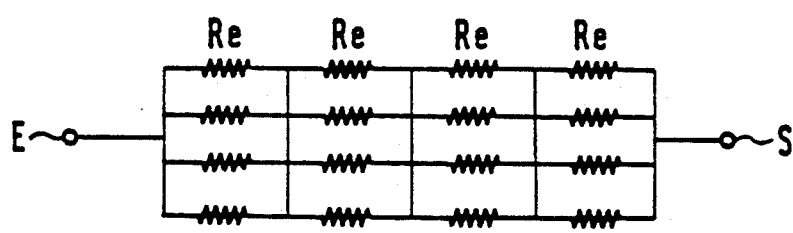
FIGS. 2 through 8 show various embodiments of a hybrid circuit in accordance with the invention.
Figure 3:
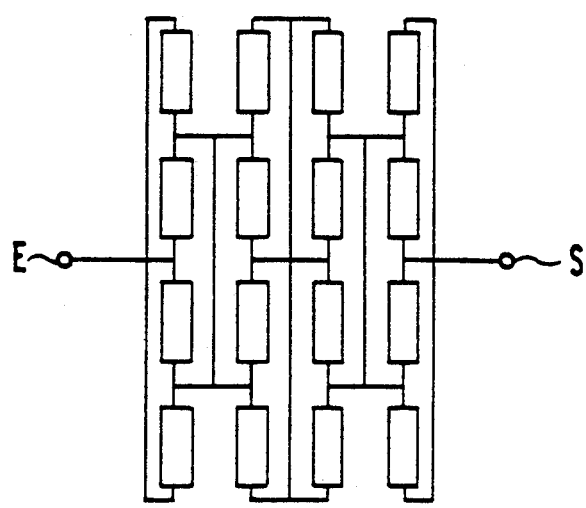

To distribute the dissipated energy homogeneously and to make the process reliable, the resistor R is formed as a sixteenth order redundant resistive cell, for example. As shown in FIG. 2, 16 individual resistors of ohmic resistance value Re are connected in parallel in groups of four. The equivalent resistance of the cell is $R = Re$. The layout of the cell shown in FIG. 3 is such that the magnetic disturbances generated by the currents flowing in it cancel out.

Figure 4:
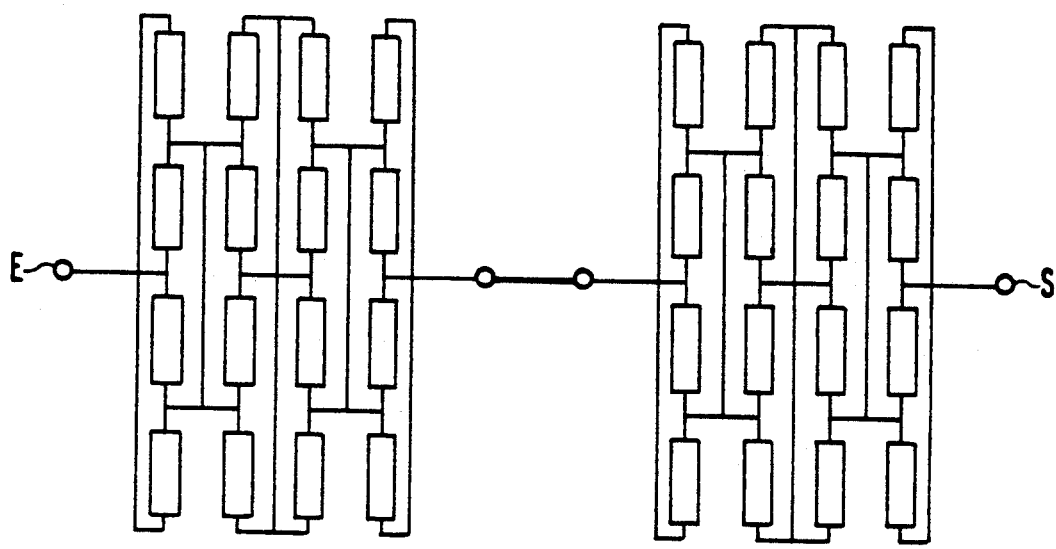
Figure 5:
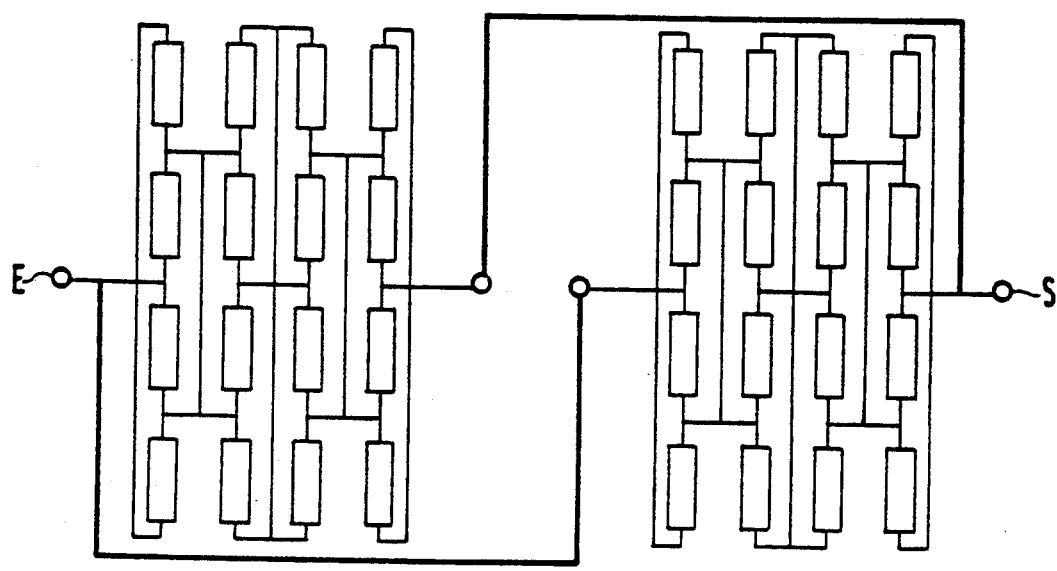

The complete heating array comprises two compensated redundant cells, for example. According to how the two cells are connected, the result is either a series network as shown in FIG. 4 in which the power dissipated is 0.5 p or a parallel network as shown in FIG. 5 in which the power dissipated is 2 p. Depending on how the cells are series/parallel connected and using laser trimming to adjust the silkscreened resistor values, it is possible to cover a wide range of power values for a given basic ohmic resistance Re.

Figure 6A:
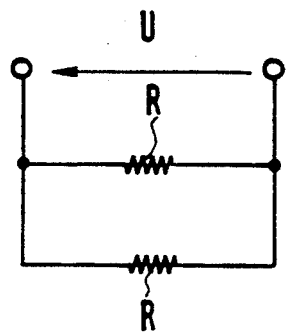
Figure 6B:
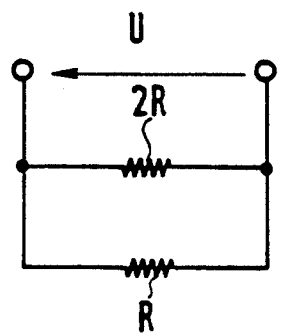
Figure 6C:
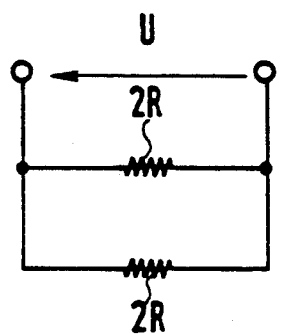
Figure 6D:
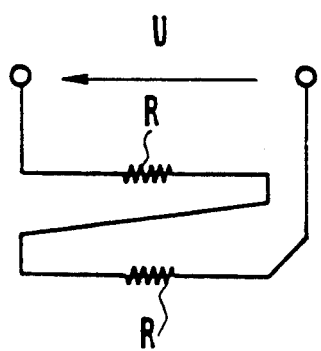
Figure 6E:
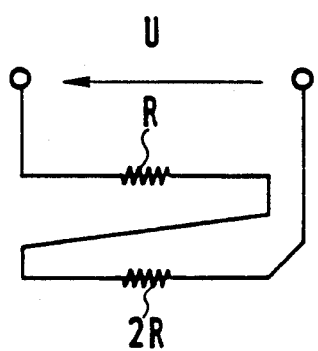
Figure 6F:
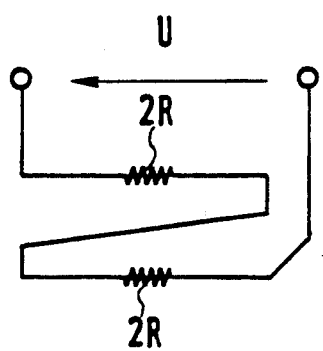

Thus different powers can be dissipated according to how the micro-heating array is connected and by laser trimming each silkscreened resistor to vary its ohmic resistance:

FIG. 6A: P = 2 p
FIG. 6B: P = 1.5 p
FIG. 6C: P = p
FIG. 6D: P = 0.5 p
FIG. 6E: P = 0.33 p
FIG. 6F: P = 0.25 p where p (power dissipated in the resistor R) = $U^2/R$.

Figure 7:
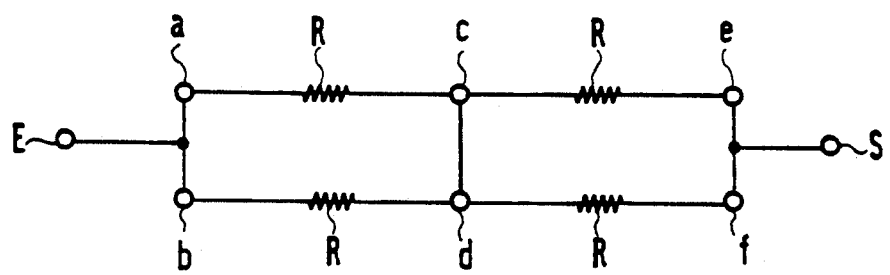
Figure 8:
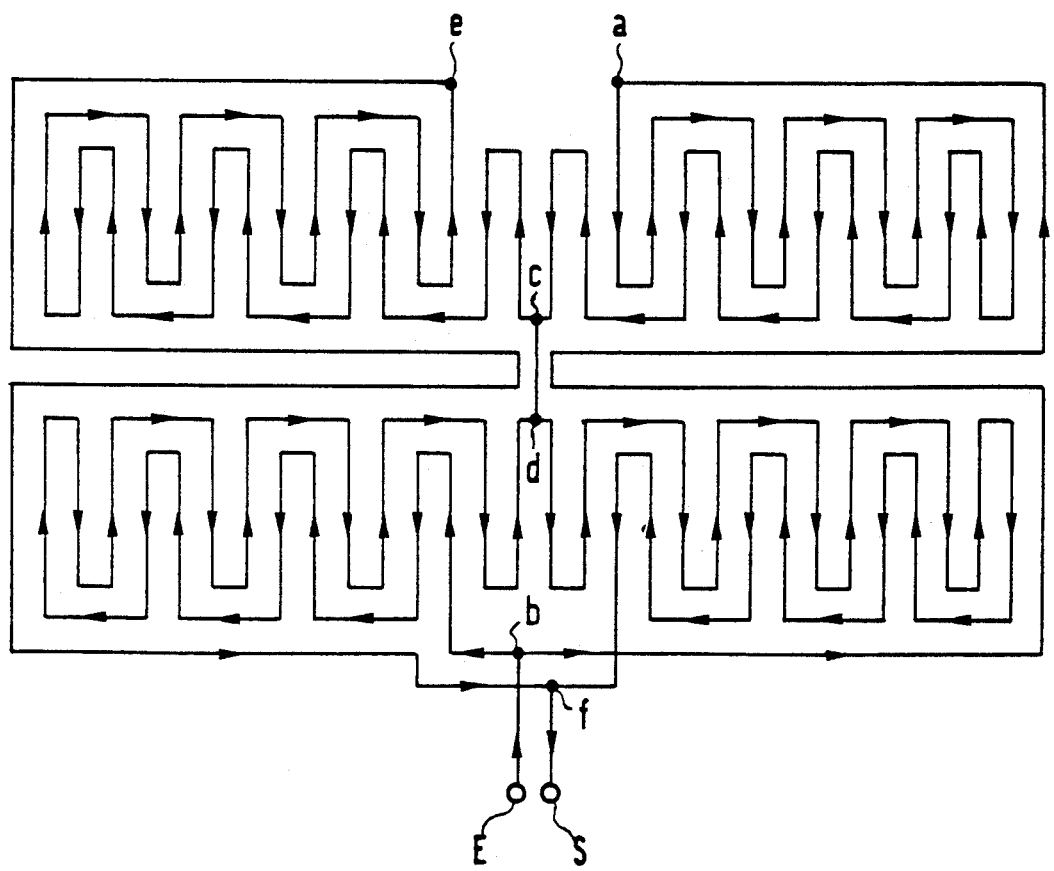

There are numerous possible variants depending on:
the array compensation architecture;
the order of redundancy of each cell;
the resistivity of the ink employed;
the silkscreening technique: thick-film or thin-film;
the manner in which the heating resistance is obtained: blocks of resistive ink, or conductive tracks: FIGS. 7 and 8, for example, show a compensated heating array silkscreened with conductive ink.

In one method of manufacturing the circuit in accordance with the invention using hybrid technology, the resistance array is silkscreened in a single pass using an approved ink; the value obtained is 5 k$\Omega$±10%. This procedure meets requirements for space applications. The component side is connected to the resistance array by a specific connection or at the edge of the substrate. The wired substrate is disposed in a box of nickel-plated Kovar, for example, using film bonding. It is polymerized at 150° C.

The circuit in accordance with the invention has many advantages including:
high thermal yield,
compensation of electromagnetic radiation,
high redundancy,
versatility,
low cost.

It is evident that the present invention has been described and shown by way of preferred example only and that its component parts may be replaced with equivalent parts without departing from the scope of the invention.

There is claimed:

1. Temperature-controlled electronic circuit for use on board a satellite, said circuit comprising: a support constituted by a substrate having a first face and a second face opposed to said first face, said first face supporting components of said electronic circuit, said second face comprising a resistive heating array of resistive ink deposited on said second face and forming a cellular array, said cellular array being constituted by redundant cells and having current flowing paths which compensate each other to minimize the electromagnetic radiation.

2. Electronic circuit according to claim 1 further comprising a thermistor connected to said heating array.

3. Electronic circuit according to claim 1 fabricated in hybrid technology.

* * * * *